United States Patent [19]

Temple

[11] Patent Number: 4,644,637
[45] Date of Patent: Feb. 24, 1987

[54] METHOD OF MAKING AN INSULATED-GATE SEMICONDUCTOR DEVICE WITH IMPROVED SHORTING REGION

[75] Inventor: Victor A. K. Temple, Jonesville, N.Y.

[73] Assignee: General Electric Company, Schenectady, N.Y.

[21] Appl. No.: 567,116

[22] Filed: Dec. 30, 1983

[51] Int. Cl.$^4$ .............................................. H01L 21/265
[52] U.S. Cl. ........................................ 29/571; 29/575; 29/589; 29/590; 148/DIG. 53; 148/DIG. 106; 148/DIG. 126; 148/1.5
[58] Field of Search ................ 29/578, 571, 589, 590, 29/576 B; 148/DIG. 53, DIG. 106, DIG. 126, 1.5, DIG. 76; 357/43, 86

[56] References Cited

U.S. PATENT DOCUMENTS

| | | | |
|---|---|---|---|
| 3,909,925 | 10/1975 | Forbes et al. | 29/591 |
| 4,199,774 | 4/1980 | Plummer | 357/41 |
| 4,364,073 | 12/1982 | Becke et al. | 357/23 |
| 4,417,385 | 11/1983 | Temple | 29/571 |
| 4,430,792 | 2/1984 | Temple | 29/571 |

FOREIGN PATENT DOCUMENTS

| | | | |
|---|---|---|---|
| 48174 | 5/1981 | Japan | 29/571 |
| 25265 | 2/1983 | Japan | 29/571 |

OTHER PUBLICATIONS

Leboss, Bruce, "Power Transistors Unite MOS, Bipolar", *Electronics*, Apr. 21, 1981.

Specification and Drawings for SN 396,172, filed on 7 Jul. 1982, by VAK Temple.

*Primary Examiner*—Brian E. Hearn
*Assistant Examiner*—John T. Callahan
*Attorney, Agent, or Firm*—John R. Rafter; James C. Davis, Jr.; Marvin Snyder

[57] ABSTRACT

An insulated-gate semiconductor device, such as an IGFET or IGT, with improved source-to-base shorts includes, in a semiconductor wafer, a drain region, a voltage-supporting region, a base region, and a source region. Generally parallel gate fingers of refractory material are insulatingly spaced above the wafer. Elongated base portions are provided between, and preferably registered to, a respective pair of adjacent gate fingers. Elongated source portions are each situated within a respective base portion and each is preferably registered to a respective pair of adjacent gate fingers. Generally parallel shorting portions are included in the wafer and are oriented transverse to the gate fingers, whereby the shorting portions can be formed without a critical alignment step. The shorting portions adjoin the base portions and also a source electrode so as to complete source-to-base electrical shorts. Parasitic majority current carriers in the base portions are readily drawn into the shorting portions, which are preferably situated very close to each other and, then, are conducted to the source electrode. Accordingly, the shorting portions are highly effective at reducing parasitic currents in the device.

16 Claims, 12 Drawing Figures

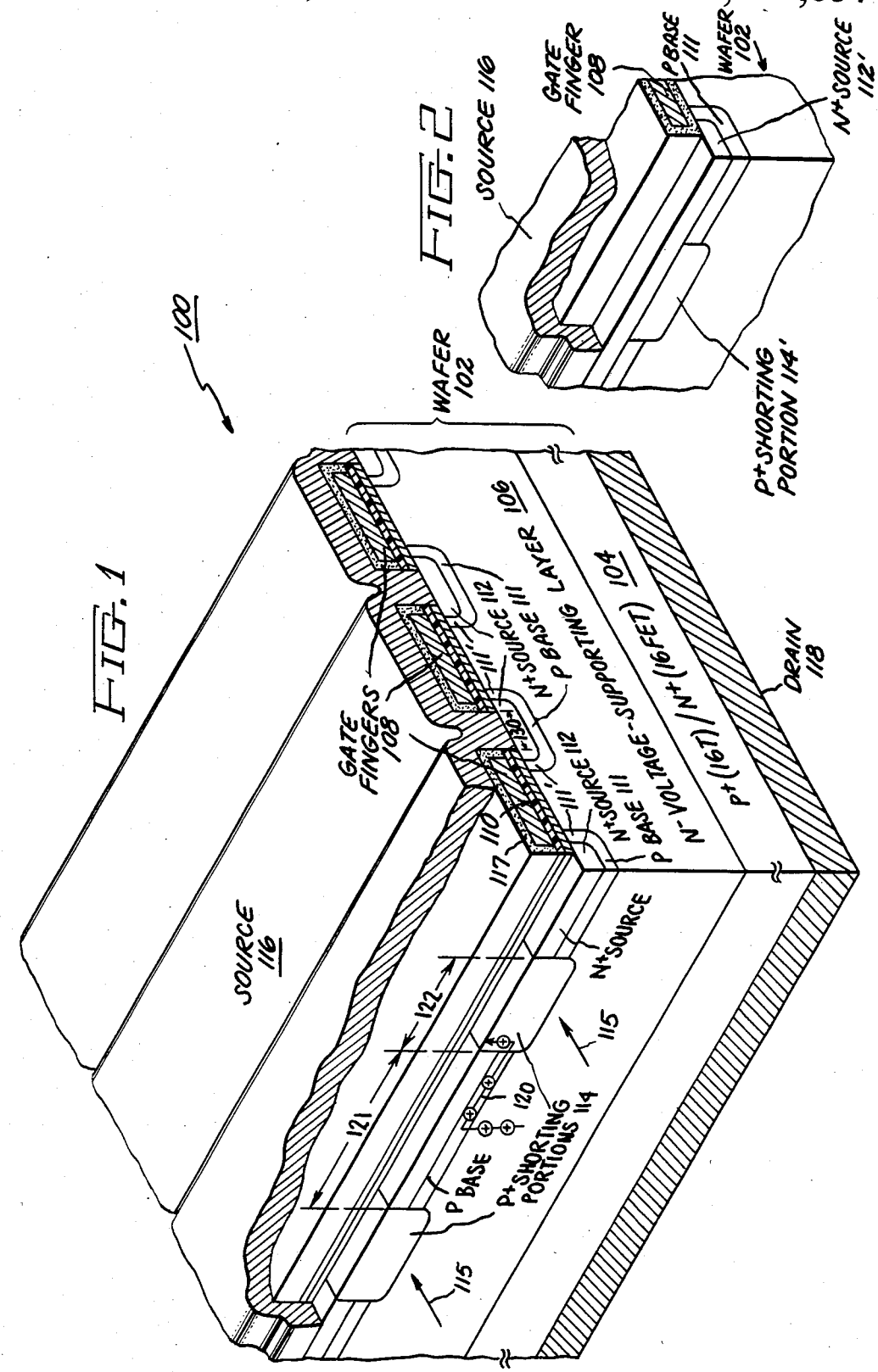

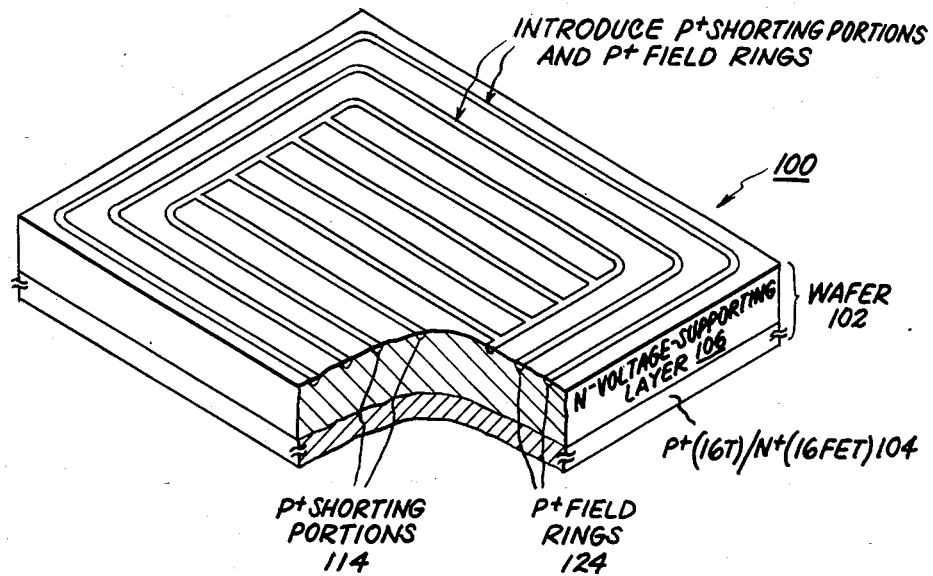
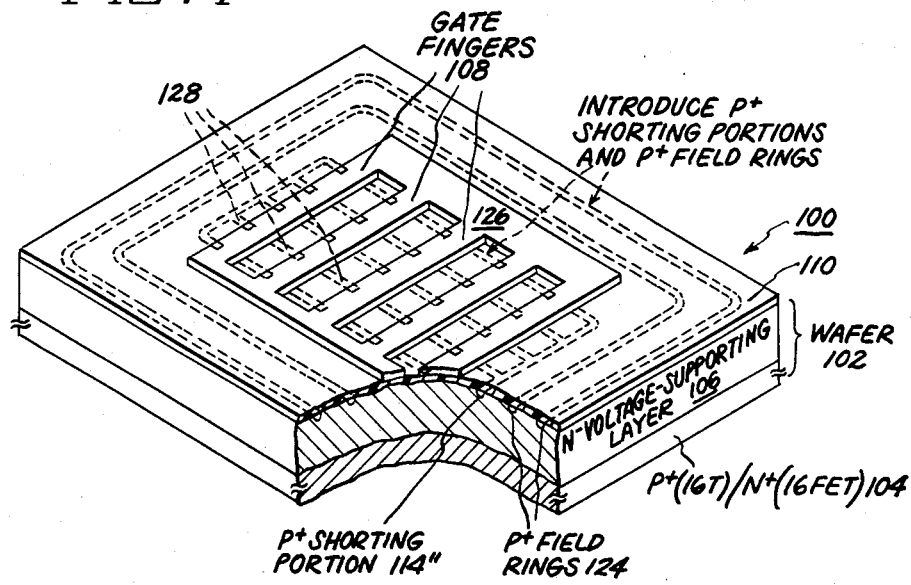

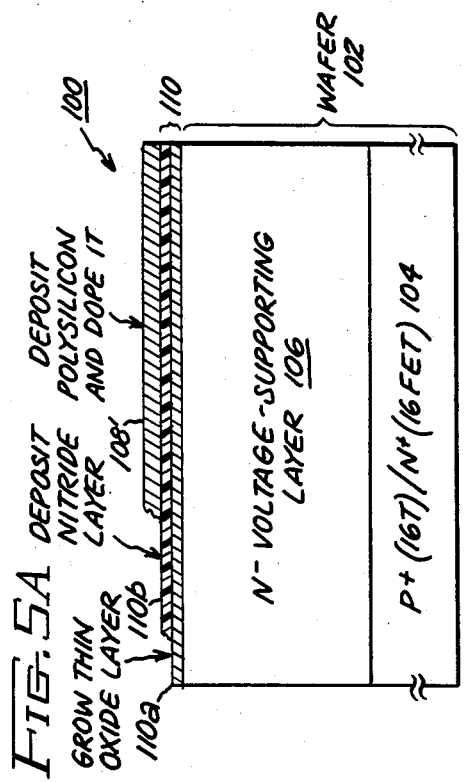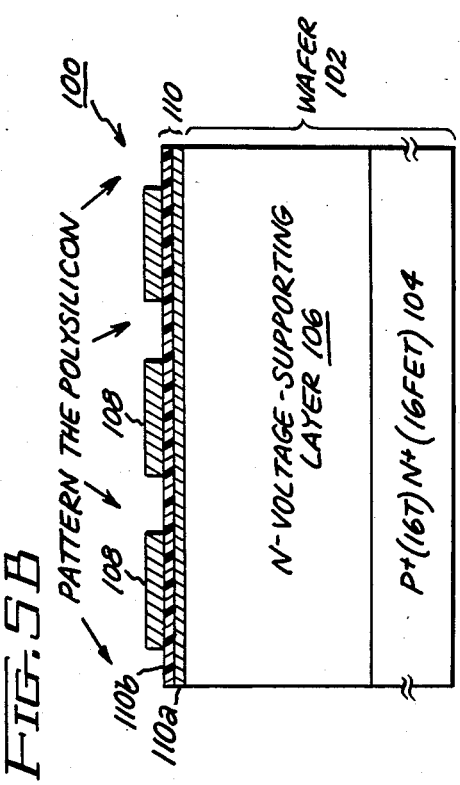

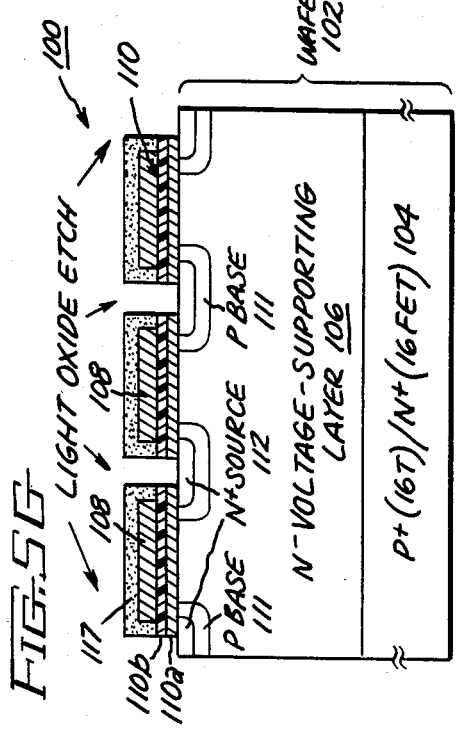
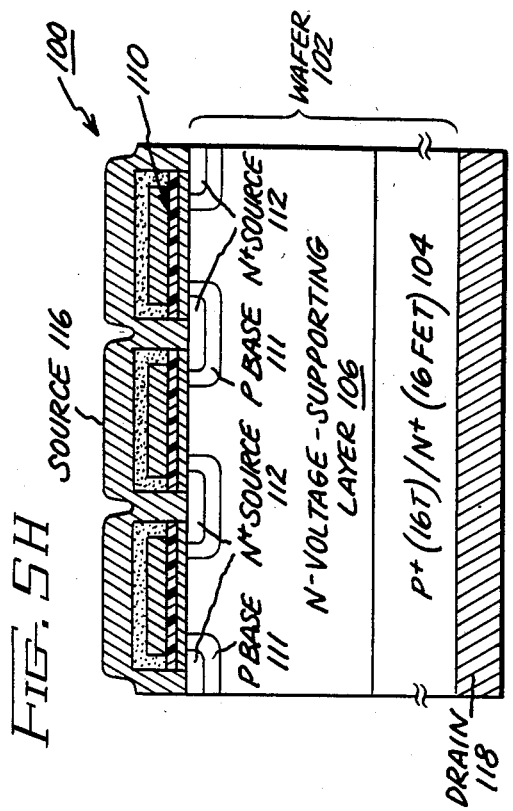
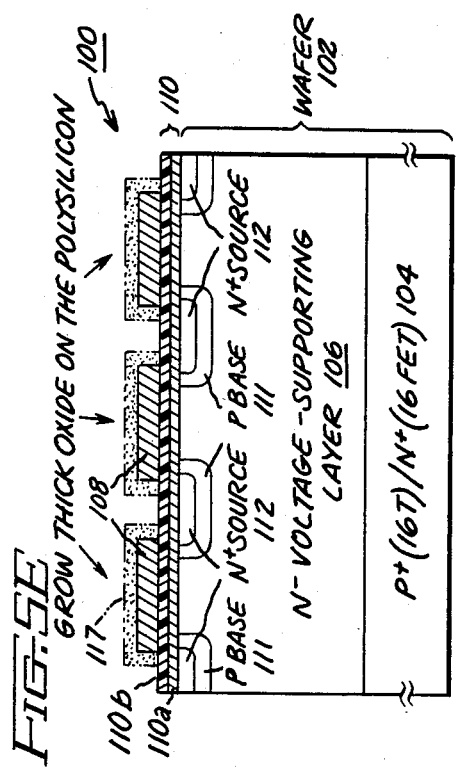
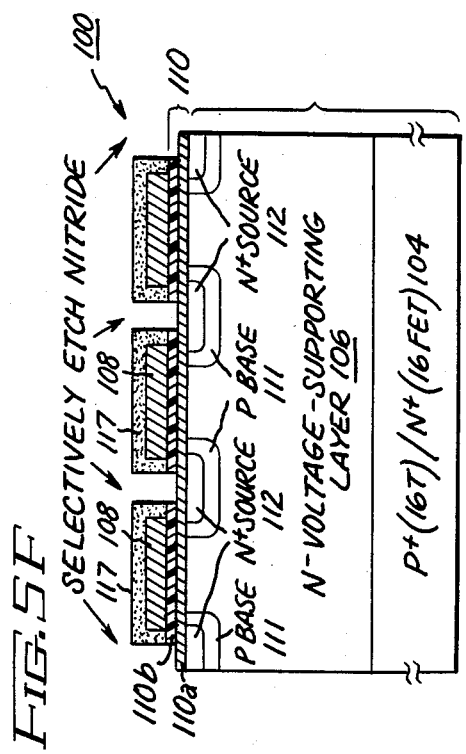

METHOD OF MAKING AN INSULATED-GATE SEMICONDUCTOR DEVICE WITH IMPROVED SHORTING REGION

Background and Summary of the Invention

The present invention relates to insulated-gate semiconductor devices incorporating electrical shorts between a device electrode and an inner semiconductor region for reducing parasitic currents, and also to a method of fabricating this type of semiconductor device.

A typical, insulated-gate semiconductor device comprises a power, insulated-gate, field-effect transistor (power IGFET). A power IGFET, in one version, includes an N+ (or highly doped N conductivity type) bulk semiconductor substrate constituting a drain region, with an N− (or lightly doped N conductivity type) epitaxial layer situated atop the N+ bulk substrate. In the upper portion of the N− epitaxial layer, a P base region is situated, and, in the upper portion of the P base region, an N+ source region, generally toroidal in shape (i.e., doughnut-shaped) is situated. A source electrode overlies the N+ source region and also the portion of the P base region in the center of the toroidally-shaped N+ source region, thereby establishing a source electrode-to-base region electrical short (hereinafter, simply "source-to-base short"). Holes (or positive charge current carriers) in the P base region are attracted to this source electrode and harmlessly enter the source electrode. This is known to reduce unwanted parasitic current in the IGFET that occurs due to the inherent N-P-N bipolar transistor contained in the IGFET and formed by the N+ drain region in combination with the N− voltage-supporting region, the P base region, and the N+ source region. A power IGFET of the foregoing type is described, for instance, in D. Kahng, editor, *Applied Solid State Science-Silicon Integrated Circuits-Part B*, New York: Academic Press (1981), pages 209–210.

Another insulated-gate semiconductor device comprises an insulated-gate transistor (IGT), which, in a particular configuration, is structurally similar to the foregoing IGFET except for the inclusion of a P+ drain region rather than an N+ drain region, as in the IGFET. Source-to-base shorts in an IGT prevent a particularly undesirable parasitic current: regenerative thyristor current due to the inherent P-N-P-N thyristor structure in the IGT formed by the P+ drain region, the N− voltage-supporting layer, the P base region, and the N+ source region. This parasitic current in an IGT, if unchecked by source-to-base shorts, causes the device to latch into a conductive state, with control of device current by the device gate being lost until the device current level is reduced by other means.

In both an IGFET and an IGT, it is desirable that holes in the P base region have a small maximum distance of travel to a source-to-base short. In the foregoing IGFET and IGT, holes in the P base region have a maximum distance of travel to a short that is approximately equal to the lateral width of the N+ source region as measured from a point at the inner periphery of the toroidal N+ source region to the outer periphery of the N+ source region. Unfortunately, this distance cannot be readily reduced below a minimum amount of several microns, constituting two alignment tolerances plus two N+ source lateral diffusions lengths, due to processing constraints in fabricating the devices. It would thus be desirable to provide an insulated-gate semiconductor device having source-to-base shorts with a small maximum travel length to the shorts for majority current carriers in the base region.

Insulated-gate semiconductors that are complementary in structure to the foregoing devices can be formed in which P-conductivity type semiconductor material is used in lieu of N-conductivity type material, and vice versa. Thus, the following discussion of the invention should be read with this in mind.

Accordingly, it is an object of the invention to provide an insulated-gate semiconductor device having improved source-to-base shorts in which the maximum length of travel to the shorts for holes in the P base region is smaller than in the above-described prior art devices.

Another object of the invention is to provide a method of fabricating an insulated-gate semiconductor device incorporating improved source-to-base shorts in which the shorts can be fabricated without a critically-aligned masking step.

A further object of the invention is to provide an insulated-gate semiconductor device having a low forward voltage drop.

The foregoing objects are achieved in an insulated-gate semiconductor device which, in preferred form, includes a wafer of semiconductor material, and a plurality of generally parallel gate fingers of refractory material insulatingly spaced atop the wafer. P base portions are included in the wafer and each portion is disposed between a respective pair of adjacent gate fingers. N+ source portions are included, each of which is situated within a respective P base portion and overlies a part thereof. The P base portions and N+ source portions are registered to the gate fingers in a particular, preferred embodiment resulting in an increased number of P base portions (and N+ source portions) in a device of a given size. Consequently, the device attains a low forward voltage drop. This is because each additional P base portion represents approximately the same unit of electrical resistance that is connected in parallel fashion with the other P base portions, thereby resulting in lower device resistance and, hence, lower forward voltage drop for a given device current level.

Further included in the foregoing wafer are a plurality of generally parallel P+ shorting portions that are oriented in their lengthwise directions transverse (or crosswise) to the gate fingers. The P+ shorting portions extend sufficiently far into the wafer as to adjoin the P base portions beneath the N+ source portions. The P+ shorting portions can be formed without the need for a critically-aligned masking step since they only need to be transversely oriented to the gate fingers. The P+ shorting portions are highly conductive to holes and are contacted by a source electrode so as to comprise source electrode-to-base shorts. The P+ shorting portions can be formed extremely close to each other so that holes in the P base portions have only a short maximum distance to travel to the P+ shorting portions.

In accordance with a preferred method of fabricating an insulated-gate semiconductor device having improved source-to-base shorts, there is provided a wafer of semiconductor material including a drain region overlain by an N− voltage-supporting region. P+ shorting portions are preferably then introduced into the upper portion of the N− voltage-supporting layer and are situated generally parallel to each other. The formation of the P+ shorting portions can occur subsequently in the fabrication process, however. No critical alignment step is required to form the P+ shorting portions. An insulating layer is formed atop the wafer and preferably comprises an oxide layer overlain by a layer that resists thermal oxide growth thereon, such as silicon nitride. Gate fingers of highly-doped polysilicon (N- or P- conductivity type), are formed atop the insulating layer. The gate fingers are oriented merely transverse to the P+ shorting portions and thus do not require a critical alignment step for their formation. P base portions are next formed in the wafer, each portion being situated between a respective pair of adjacent gate fingers. This is followed by formation in the wafer of N+ source portions, each being situated in a respective P base portion. The P+ shorting portions extend sufficiently far into the wafer as to adjoin the P base portions. The P+ shorting regions can be formed extremely close to each other so that the maximum travel distance for holes in the P base portions to the nearest P+ shorting region is very small.

The P base portions and N+ source portions of the device of the present fabrication method are preferably registered to the gate fingers and can be formed in this manner by implantation of suitable dopant through the insulating layer atop the wafer, which preferably comprises an oxide layer overlain by a nitride layer. With the P base portions registered to the gate fingers, many P base portions can be fabricated in a device of a given size so as to reduce the device forward voltage drop. The foregoing, preferred insulating layer is removed in two steps before metallization is applied to the upper surface of the device and appropriately patterned into source and gate regions. Drain metallization is provided on the lower surface of the drain region.

BRIEF DESCRIPTION OF THE DRAWINGS

While the specification concludes with claims defining the features of the invention that are regarded as novel, the invention itself, as to both organization and method of operation, will be better understood from considering the following description in connection with the drawing figures, in which:

FIG. 1 is a tridimensional view, partially in cross-section, of a semiconductor device in accordance with the invention;

FIG. 2 is a tridimensional view of a fragment of the semiconductor device of FIG. 1, illustrating an alternative structure for the P+ shorting portion and N+ source portion;

FIG. 3 is a tridimensional view of a partially cut away semiconductor wafer undergoing one form of fabrication of a P+ shorting portion as illustrated in FIG. 1;

FIG. 4 a tridimensional view of a partially cut away semiconductor wafer undergoing another form of fabrication of a P+ shorting portion as illustrated in FIG. 1; and FIGS. 5A–5H are cross-sectional views of a semiconductor wafer undergoing various steps in the formation of the automatically-registered N+ source portions and P base portions as illustrated in FIG. 1.

DESCRIPTION OF THE PREFERRED EMBODIMENTS

Turning to FIG. 1, there is shown a portion of an insulated-gate semiconductor device 100 in accordance with the invention. Semiconductor device 100 includes a wafer of semiconductor material 102, preferably silicon, which, in turn, includes a substrate layer 104, preferably comprising bulk semiconductor material doped to P+ if semiconductor device 100 comprises an IGT, while doped to N+ if device 100 comprises an IGFET. Wafer 102 further includes an N− voltage-supporting layer 106, which typically is epitaxially grown atop substrate 104.

Atop N− voltage-supporting layer 106 are situated a plurality of gate fingers 108, preferably comprising refractory material such as a metal silicide or polysilicon that is highly doped with N- or P- conductivity type dopant so as to be conductive. Gate fingers 108 are interconnected at some location in semiconductor device 100, which is not shown in FIG. 1. Gate fingers 108 are generally parallel to each other and are spaced from wafer 102 by insulation 110, which is preferably multi-layered, as discussed in detail below.

Situated at the upper portion of N− voltage-supporting layer 106 are a plurality of P base portions 111 and a plurality of N+ source portions 112. P base portions 111 comprises respective, elongated regions, each of which is situated between a respective pair of adjacent gate fingers 108. P base portions 111 are preferably registered to gate fingers 108, as discussed in detail below. Similarly, N+ source portions 112 comprise respective, elongated semiconductor regions each of which is situated between a respective pair of gate adjacent fingers 108, with portions 112 preferably being registered to gate fingers 108, as discussed in detail below. As can be appreciated from FIG. 1, each of N+ source portions 112 is situated within a respective P base portion 111 and overlies a part thereof.

Also included within wafer 102 are P+ shorting portions 114, which are oriented in their lengthwise direction, as indicated by arrows 115 generally parallel to each other. In accordance with the invention, P+ shorting portions 114 are oriented transverse to, and preferably orthogonal to gate fingers 108.

To complete semiconductor device 100, source and drain metallizations 116 and 118, respectively, are provided on the uppermost and lowermost surfaces of device 100. In particular, source metallization 116 is deposited on P+ shorting portions 114 (although such metallization is shown partially cut away in FIG. 1 for clarity of illustration) as well as on N+ source portions 112. Since P+ shorting portions 114 are highly conductive to holes, they comprise source-to-base shorts because they electrically short P base portions 111 to source metallization 116.

The efficacy of the source-to-base shorts in device 100 can be improved by reducing the electrical resistance encountered by hole current 120 in flowing to P+ shorting portions 114. This can be achieved by (1) increasing the doping concentration of P base portions 111, (2) increasing the thickness (vertical dimension) of P base portions 111, and (3) reducing the maximum distance of hole current travel in P base portions 111 by reducing separation 121 between P base shorting 114. The first two factors are relatively fixed, however, in order that channel regions 111' in P base portions 111 are easily inverted when gate fingers 108 are positively biased. Accordingly, it is preferred that separation 121 between adjacent P+ shorting portions 114 be small, with less than about 30 microns being preferred and less than about 12 microns being most preferred. This is because the maximum hole travel length to P+ shorting portions 114 for hole current 120 that enters P base portions 111 is half of dimension 121. With such dimension being reduced, the maximum hole travel length is proportionately reduced. Fortunately dimension 121 can be made arbitrarily small and even approach zero; however, a very small dimension 121 results in a much reduced current-carrying capability of device 100, since only the regions of P base portions 111 between adjacent P+ shorting portions 114 conduct device current. It is also desirable that the lateral dimension of P+ shorting portions 114, such as dimension 122, be minimized in order to increase the maximum current-carrying capability of semiconductor device 100. This is because P+ shorting portions 114 do not contribute to the current-carrying capacity of the device.

Alternative P+ shorting portions 114' are illustrated in the fragmentary, detail view of FIG. 2, in which an alternative N+ source portion 112' is shown overlying P+ shorting portion 114'. This arrangement can be achieved by doping N+ source portion 112' to a higher dopant concentration than P+ shorting portion 114'. This arrangement facilitates the provision of a good ohmic contact between source metallization 116 and N+ source portion 112'. In this arrangement, P+ shorting portion 114' is ohmically connected to source metallization 116 at a location (not shown) where N+ source region portion 112' is not present so that P+ shorting portion 114' extends to the upper surface of wafer 102.

A significant feature of the present invention is that P+ shorting portion 114 can be implemented without the use of a critically-aligned masking step. P+ shorting portions 114 may be formed before or after gate fingers 108 have been formed. FIG. 3 illustrates the formation of P+ shorting portions 114 prior to formation of gate fingers 108 (FIG. 1).

In FIG. 3, wafer 102 is shown at reduced scale from that illustrated in FIG. 1. While P+ shorting portions 114 are shown as an interconnected grid, they can alternatively comprise separate portions. P+ shorting portions 114 and P+ field rings 124 are shown as being introduced into the upper surface of N− voltage-supporting layer 106. This is suitably accomplished through diffusion or ion implantation of dopant impurities, with a typical dopant concentration for these regions being $5 \times 10^{19}$ dopant atoms per cubic centimeter.

P+ shorting portions 114 are situated in the center, or current-carrying portion, of semiconductor device 100, commonly referred to as the 'active" region, while P+ field rings 124 are situated at the periphery of wafer 102, which does not carry device current and is commonly referred to as the "device termination" region. P+ field rings 124 are used to enhance the breakdown voltage of device 100 according to a well-known technique in the art. P+ shorting portions 114 and P+ field rings 124 can be simultaneously formed so as to simplify device processing. Additionally, the mask (not shown) used in the formation of P+ shorting portions 114 and P+ field rings 124 does not need to be critically aligned with any previous features of wafer 102. The gate fingers 108 (FIG. 1) that are oriented transverse to individual P+ shorting portions 114 can thereafter be formed without critical alignment to P+ shorting portions 114, since the gate fingers only need to be transverse to P+ shorting portions 114.

Considering again FIG. 1, if P+ shorting portions 114 are to be formed after the formation of gate fingers 108, a suitable procedure for implementing P+ shorting portions 114 is illustrated in FIG. 4.

Considering now FIG. 4, wafer 102 is shown at reduced scale from that illustrated in FIG. 1. Atop wafer 102 is insulation layer 110, which is shown as a single layer for simplicity, but which may comprise multiple layers, as discussed in detail below. Gate fingers 108 are shown comprising one possible grid pattern with an enlarged gate bonding pad area 126 provided for use in making electrical contact to external circuitry (not shown). Without the need for a critically-aligned mask, P+ shorting portions 114" and P+ field rings 124 (both shown by dashed lines) can be simultaneously introduced into the upper portion of N− voltage-supporting layer 106, through insulation 110. This introduction of impurities is preferably carried out by means of ion implantation so as to introduce dopant atoms through insulation layer 110 but not through gate fingers 108, at least when the fingers comprise polysilicon. With gate fingers 108 serving as an implantation mask, P+ shorting portions 114" comprise segments, such as segments 128, which are not connected to each other, with groups of the segments being aligned in their lengthwise directions with each other. P+ shorting portions 114" could alternatively be introduced into wafer 102 after insulation 110 between adjacent gate fingers 108 is removed, prior to device metallization. In this case, the introduction of dopant is preferably carried out by diffusion.

Considering again FIG. 1, it is preferred that the spacing between adjacent gate fingers 108, such as spacing 130 between the two leftmost illustrated gate fingers 108, be very small in order to reduce the forward voltage drop of device 100 for a given size device. This is because, with spacing 130 being small, device 100 can contain a larger number of P base portions 111 (and N+ source portions 112), each representing a parallel, electrical resistance, so that the overall device resistance is reduced. This, in turn, reduces the forward voltage drop of device 100 for a given level of device current. A technique for accomplishing a reduction of spacing 130 is described below in connection with FIGS. 5A-5H.

Considering now FIG. 5A, a preferred technique of fabricating semiconductor device 100, as viewed from the right in FIG. 1, is illustrated. A thin oxide layer 110a is formed atop wafer 102, preferably by a thermal growth process, with a typical thickness of about 800 angstroms. Atop oxide layer 110a there is formed a further insulating layer 110b, comprising a dielectric material that resists the thermal growth of oxide thereon, such as a 400-angstrom thick layer of silicon nitride, for reasons that will become apparent below. Gate electrode layer 108' is preferably formed directly atop nitride layer 110b, although other intermediate insulation layers may be provided under electrode layer 108' if desired. Layer 108' comprises polysilicon that is highly doped so as to be conductive, or other conductive, refractory material such as a metal silicide.

As next illustrated in FIG. 5B, gate electrode layer 108' is patterned, suitably with conventional photoresist and etch technique, so as to provide elongated gate fingers 108.

In FIG. 5C the formation of P base portions 111, shown in phantom, is illustrated, with gate fingers 108 constituting dopant masks. Introduction of a suitable dopant is preferably accomplished by ion implantation to permit the dopant to pass through insulation layer 110 and into wafer 102. P base portions 111 are initially much shallower than as shown, and then are thermally driven, in one or more heating steps, so as to assume the final configuration as illustrated. Thereafter, as illustrated in FIG. 5D, N+ source portions 112, shown in phantom, are formed, again, preferably by ion implantation to permit suitable dopant to pass through insulation layer 110 into wafer 102. N+ source portions 112 are initially much shallower than as shown, and then are thermally driven, in one or more heating steps, to the final configuration as illustrated.

By forming P base portions 111 and N+ source portions 112 in the manner illustrated in FIGS. 5C and 5D, the lateral dimension 130 (FIG. 5D) between adjacent gate fingers 108, can be small, thereby resulting in enhanced current-carrying capability of device 100.

As next illustrated in FIG. 5E, a thick oxide 117 (shown in phantom) is grown over the polysilicon gate fingers 108, preferably by thermal growth, with a typical thickness being about 3000 angstroms. Oxide 117, when thermally grown, does not form over nitride layer 110b.

The portions of nitride layer 110b shown between adjacent gate fingers 108 in FIG. 5E are next removed as illustrated in FIG. 5F by a selective etch of nitride layer 110b. This is carried out by using an etchant that etches silicon nitride much more quickly than silicon oxide. A suitable etchant of this type comprises hot phosphoric acid.

In FIG. 5G the step of removing the portions of oxide layer 110a between adjacent gate fingers 108 is illustrated. This is suitably carried out by performing a light oxide etch that completely removes the unwanted portions of oxide layer 110a but only partially removes oxide layer 117, since oxide layer 117 is thicker than oxide layer 110a.

As finally illustrated in FIG. 5H, source metallization 116 is applied to the upper surface of device 100. Additionally, drain metallization 118 is applied to the lower surface of device 100, this being performed at any convenient point in the fabrication process of device 100.

The foregoing describes an insulated-gate semiconductor device with non-critically aligned shorting portions and which may include base and source portions that are registered to gate fingers so as to result in a device with low forward voltage drop. A method of fabricating such semiconductor device is additionally described.

While the invention has been described with respect to specific embodiments by way of illustration, many modifications and changes will occur to those skilled in the art. For example, insulation layer 110 (FIG. 1) could be replaced by homogeneous insulation comprising silicon oxide, for example, although spacing 130 between adjacent gate fingers would have to be increased, with device forward drop being higher. It is, therefore, to be understood that the appended claims are intended to cover the foregoing and all such modifications and changes as fall within the true spirit and scope of the invention.

What is claimed is:

1. A method of fabricating an insulated-gate semiconductor device with an improved shorting region, said method including the steps of:
   (a) providing a wafer of semiconductor material including a drain region and a voltage-supporting layer of one conductivity type overlying said drain region;
   (b) providing an insulating coating atop said wafer;
   (c) introducing into said voltage-supporting layer shorting portions of opposite conductivity type that are generally parallel to each other;
   (d) forming a plurality of generally parallel gate fingers that are situated atop said insulating coating and transverse to said shorting portions; and
   (e) forming base portions of the opposite conductivity type in the upper part of said voltage-supporting layer and forming source portions of the one conductivity type, each source portion being situated within a respective base portion.

2. The fabrication method of claim 1 wherein the step of introducing said shorting portions follows the step of forming said gate fingers.

3. The fabrication method of claim 1 wherein the step of forming an insulating coating atop said wafer comprises:
   (a) forming a layer of oxide atop said wafer; and
   (b) forming a further layer of insulation over said layer of oxide that is resistant to thermal oxide growth thereon.

4. The fabrication method of claim 3 wherein said step of forming a further layer of insulation comprises forming a nitride layer.

5. The fabrication method of claim 15 wherein the steps of forming said base and source portions comprise implanting through said oxide and nitride layers said base portions followed by implanting through said oxide and nitride layers said source portions, the implanting of said base and source portions occurring while utilizing said gate fingers as an implant mark, whereby said base and source portions are registered to said gate fingers, said method further including the steps of:
   (a) thermally growing an oxide layer over said gate fingers;
   (b) selectively removing the exposed portions of said nitride layer between adjacent gate fingers;
   (c) removing the exposed portions of said firstmentioned oxide layer between adjacent gate fingers; and
   (d) metallizing the exposed portions of said semiconductor material between adjacent gate fingers.

6. The fabrication method of claim 1 further including the step of introducing into said voltsupporting layer at least one field ring of the opposite conductivity type simultaneously with the step of introducing said shorting portions, so as to simplify device fabrication.

7. The fabrication method of claim 1 wherein the step of providing a wafer with a drain region comprises providing a drain region of opposite conductivity type.

8. The fabrication method of claim 1 wherein the step of providing a wafer with a drain region comprises providing a drain region of the one conductivity type.

9. A method of fabricating an insulating-gate semiconductor device with an improved shorting region, said method including the steps of:
   (a) providing a wafer of semiconductor material including a drain region and a voltage-supporting layer of one conductivity type atop said drain region;
   (b) providing an insulating coating atop said wafer;
   (c) forming a plurality of generally parallel electrically conductive gate fingers situated atop said insulating coating;
   (d) forming shorting portions of opposite conductivity type within said voltage-supporting layer generally parallel to each other and transverse to said gate fingers; and (e) forming base portions of the opposite conductivity type in the upper part of said voltage-supporting layer and forming source portions of the one conductivity type, each source portion being situated within a respective base portion.

10. The fabrication method of claim 9 wherein the step of forming an insulating coating atop said wafer comprises:

(a) forming a layer of oxide atop said wafer; and
(b) forming a further layer of insulation over said layer of oxide that is resistant to thermal oxide growth thereon.

11. The fabrication method of claim 10 wherein and step of forming a further layer of insulation comprises forming a nitride layer.

12. The fabrication method of claim 11 wherein the steps of forming said base and source portions comprise implanting through said oxide and nitride layers said base portions followed by implanting through said oxide and nitride layers said source portions, the implanting of said base and source portions occurring while utilizing said gate fingers as an implant mark, whereby said base and source portions are registered to said gate fingers, said method further including the steps of (a) thermally growing an oxide layer over said gate fingers;
(b) selectively removing the exposed portions of said nitride layer between adjacent gate fingers;
(c) removing the exposed portions of said first-mentioned oxide layer between adjacent gate fingers; and
(d) metallizing the exposed portions of said semiconductor material between adjacent gate fingers.

13. The fabrication method of claim 9 further including the step of introducing into said voltage supporting layer at least one field ring of the opposite conductivity type simultaneously with the step of introducing said shorting portions, so as to simplify device fabrication.

14. The fabrication method of claim 9 wherein the step of providing a wafer with a drain region comprises providing a drain region of opposite conductivity type.

15. The fabrication method of claim 9 wherein the step of providing a wafer with a drain region comprises providing a drain region of the one conductivity type.

16. The fabrication method of claim 9 wherein said steps of forming gate fingers and introducing shorting portions, are performed to establish the gate fingers in a plane substantially parallel to the plane of the shorting portions.

* * * * *